(12) United States Patent
Foroudi

(10) Patent No.: US 8,547,156 B2
(45) Date of Patent: Oct. 1, 2013

(54) LINEARIZING FIELD EFFECT TRANSISTORS IN THE OHMIC REGION

(75) Inventor: Omid Foroudi, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/358,206

(22) Filed: Jan. 25, 2012

(65) Prior Publication Data

US 2013/0187683 A1    Jul. 25, 2013

(51) Int. Cl.
*H03L 5/00* (2006.01)
(52) U.S. Cl.
USPC .......... 327/308; 327/113; 327/427; 327/404; 327/374
(58) Field of Classification Search
USPC ............. 327/403, 404, 427, 430, 432, 437, 327/374, 376, 377, 419, 431, 308
See application file for complete search history.

(56) References Cited

U.S. PATENT DOCUMENTS

| | | | |
|---|---|---|---|
| 3,902,078 A * | 8/1975 | Peterson | 327/388 |
| 5,625,307 A * | 4/1997 | Scheinberg | 327/113 |
| 7,205,817 B1 | 4/2007 | Huang et al. | |
| 7,710,189 B2 | 5/2010 | Toda | |
| 7,750,716 B2 | 7/2010 | Hosoya | |
| 8,149,042 B2 | 4/2012 | Nakahara et al. | |
| 8,217,686 B2 * | 7/2012 | Falter et al. | 327/110 |
| 8,400,205 B2 | 3/2013 | Foroudi | |

OTHER PUBLICATIONS

Horowitz, Paul, et al., "The Art of Electronics", Cambridge University Press, Second edition, 1989.*

* cited by examiner

*Primary Examiner* — Long Nguyen
*Assistant Examiner* — Thomas Skibinski
(74) *Attorney, Agent, or Firm* — Knobbe, Martens, Olson & Bear, LLP

(57) ABSTRACT

Apparatus and methods are disclosed related to using one or more field effect transistors as a resistor. One such apparatus can include a field effect transistor (FET), averaging resistors and a bidirectional current source. The averaging resistors can apply an average of a voltage at the source of the FET and a voltage at the drain of the FET to the gate of the field effect transistor. The bidirectional current source can turn the FET on and off. The FET can operate in the ohmic region when on. Such an apparatus can improve the linearity of the FET as a resistor, for example, at lower frequencies near or at direct current (DC). In some implementations, the apparatus can include one or more current sources to remove an offset introduced by the bidirectional current source at the source and/or the drain of the FET.

20 Claims, 5 Drawing Sheets

US 8,547,156 B2

LINEARIZING FIELD EFFECT TRANSISTORS IN THE OHMIC REGION

TECHNICAL FIELD

The disclosed technology relates to electronic systems, and more particularly, to circuits that include one or more field effect transistors.

DESCRIPTION OF THE RELATED TECHNOLOGY

Electronic systems can use field effect transistors as resistors. For instance, in an attenuator, a field effect transistor can be used as a resistor. In an attenuator, turning the field effect transistor on and off can adjust the gain of the attenuator. For example, when the field effect transistor is on, the attenuator can provide an attenuation of 0 dB. In this example, the attenuator can provide an attenuation of 1 dB when the field effect transistor is off. However, the performance of the field effect transistor as a resistor can be degraded at certain frequencies, such as frequencies near or at direct current (DC).

It can be advantageous for a field effect transistor to behave as a linear resistor. However, in certain applications, conventional circuits that use field effect transistors have shown undesirable linearity characteristics as resistors. Accordingly, a need exists for improving the linearity of field effect transistors as resistive circuit elements.

SUMMARY OF CERTAIN INVENTIVE ASPECTS

In one embodiment, an apparatus includes a field effect transistor, a first explicit resistor, a second explicit resistor, and a bidirectional current source. The field effect transistor has a gate, a source, and a drain. The first explicit resistor has a first end coupled to the drain and a second end coupled to the gate. The second explicit resistor has a first end coupled to the source and a second end coupled to the gate. The bidirectional current source is configured to selectively turn the field effect transistor on and selectively turn the field effect transistor off. In some implementations, the field effect transistor can be configured to operate in the linear region of operation when on.

According to a number of implementations, the first explicit resistor and the second explicit resistor can be configured to apply an averaging voltage to the gate of the field effect transistor, in which the averaging voltage can be indicative of an average of a voltage at the drain and a voltage at the source. In some of these implementations, the first explicit resistor and the second explicit resistor can be configured to allow the field effect transistor to operate linearly down to direct current (DC). The first explicit resistor and the second explicit resistor can be configured to allow the field effect transistor to operate linearly at frequencies less than or equal to approximately 300 kHz, in accordance with various implementations.

In a number of implementations, the first explicit resistor and the second explicit resistor can be configured to reduce a difference between a DC voltage at the gate and an average of a DC voltage at the drain and a DC voltage at the source.

In some implementations, the apparatus can include a second current source configured to reduce a DC offset at the source, in which the DC offset at the source is generated by the bidirectional current source. According to some of these implementations, the apparatus can also include a third current source configured to reduce a DC offset at the drain, in which the DC offset at the drain is generated by the bidirectional current source. The second current source and the third current source can be configured to prevent the field effect transistor from turning on when a relatively large voltage is applied to the drain, according to certain implementations.

In accordance with various implementations, the resistance of the first explicit resistor can be approximately equal to a resistance of the second explicit resistor.

According to certain implementations, the field effect transistor is embodied in an attenuator, a rectifier, or a programmable filter.

The resistance of the first explicit resistor can be at least 10 times greater than the effective resistance in parallel with the source and the drain of the field effect transistor, according to some implementations.

In another embodiment, an apparatus includes a field effect transistor and averaging resistors. The field effect transistor has a gate, a source, and a drain. The field effect transistor is configured to operate in the linear region of operation when on. The averaging resistors are configured to apply an averaging voltage to the gate of the field effect transistor at frequencies less than or equal to approximately 4 MHz. The averaging voltage is indicative of an average of a voltage at the source of the field effect transistor and a voltage at the drain of the field effect transistor.

According to certain implementations, the apparatus can include at least one current source configured to reduce a DC offset at the source and a DC offset at the drain.

In another embodiment, a method of using a field effect transistor is provided. The method can include controlling activation of the field effect transistor; operating the field effect transistor in the ohmic region; and applying an averaging voltage to the gate of the field effect transistor via explicit averaging resistors, in which the averaging voltage is indicative of an average of a voltage at the drain of the field effect transistor and a voltage at the source of the field effect transistor, in which a first resistor of the explicit averaging resistors is coupled to the drain, and in which a second resistor of the explicit averaging resistors is coupled to the source In accordance with some implementations, applying is performed at DC.

According to certain implementations, controlling can be performed by a bidirectional current source. In some of these implementations, the method can include reducing a DC offset introduced at the source by the bidirectional current source. Reducing can be performed by at least one other current source, according to a number of implementations. The method can include reducing a DC offset introduced at the drain by the bidirectional current source, according to various implementations.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
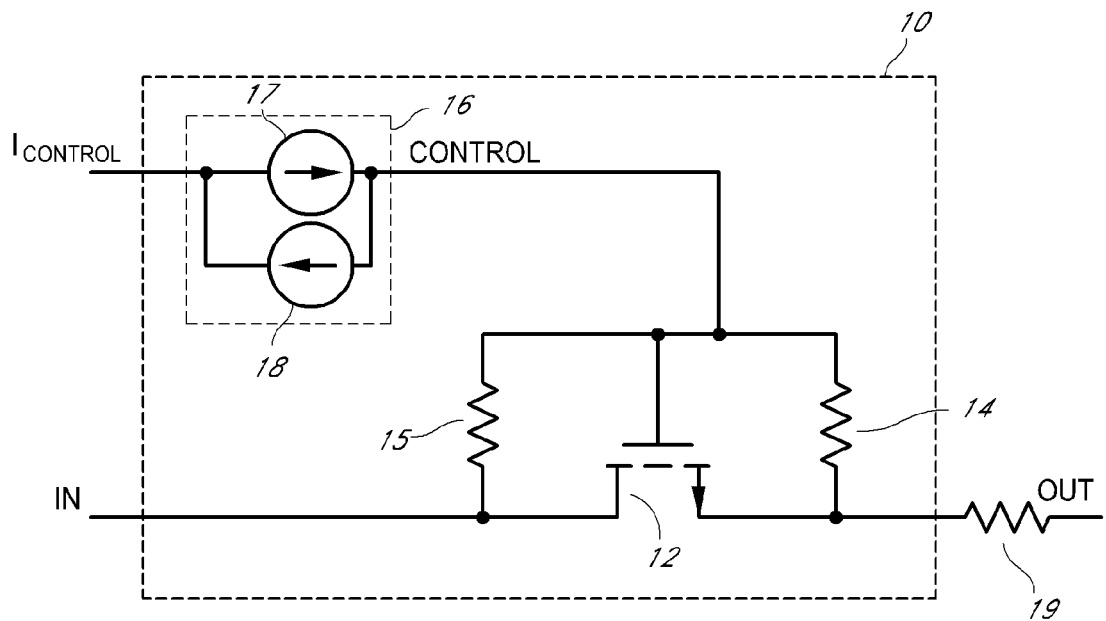
FIG. 1 is a schematic diagram illustrating a linear resistance circuit including a field effect transistor, according to an embodiment.

The following detailed description of certain embodiments presents various descriptions of specific embodiments of the inventions. However, the inventions can be embodied in a multitude of different ways as defined and covered by the claims. In this description, reference is made to the drawings where like reference numerals indicate identical or functionally similar elements.

As discussed above, an electronic system can utilize one or more field effect transistors, such as NMOS devices, as resistors. Previous methods of linearization have linearized field effect transistors at frequencies above a pole frequency, which can be determined by parasitic capacitances of the field effect transistors and/or isolation resistors coupled to the gates of the field effect transistors. At lower frequencies below the pole frequency, the linearity of field effect transistors in previous circuits has been degraded. For instance, non-linearity of the field effect transistors in previous circuits from approximately 4 MHz down to DC has impacted performance.

Generally described, aspects of this disclosure relate to improving linearity of a field effect transistor as a resistor. Averaging resistors can apply an average of a voltage at the source and a voltage at the drain to the gate of the field effect transistor. A current source, such as a bidirectional current source, can turn the field effect transistor on and off. The averaging resistors and the current source can eliminate a square law non-linearity of the field effect transistor, thereby improving the performance of the field effect transistor as a linear resistor. Among other things, the averaging resistors and the current source can improve the linearity of the field effect transistor at lower frequencies down to DC, for example, frequencies of about 4 MHz or less. Circuit designers can implement such circuits in a variety of applications. For instance, such circuits can provide desirable linearity characteristics in the presence of relatively high common mode signals.

With reference to FIG. 1, an example linear resistance circuit 10 will be described. A control signal $I_{CONTROL}$ can selectively control the linear resistance circuit 10 so as to generate an output OUT having a linear relationship with an input IN when the control signal $I_{CONTROL}$ is asserted. When the control signal $I_{CONTROL}$ is not asserted, the linear resistance circuit 10 does not drive the output OUT. The linear relationship may be between a current provided to the input IN and a potential difference (i.e., a voltage) between the input node and the output node. The linear relationship may result from a field effect transistor 12 operating in the linear region, which may also be referred to as the "ohmic region." In such an example, the linear relationship may be between a current provided to a drain of the field effect transistor $I_D$ and the voltage from the drain to a source $V_{DS}$ of the field effect transistor. By operating the field effect transistor 12 in the linear region, the field effect transistor 12 may be used as a linear resistor. The linear resistance circuit 10 can be embodied, for example, in an attenuator and/or a programmable filter. An illustrative attenuator will be described later with reference to FIG. 3 and an illustrative programmable filter will be described later with reference to FIG. 5.

The linear resistance circuit 10 can include a field effect transistor 12 having a gate, a source, and a drain. It will be understood that, in some implementations, the source and the drain of a field effect transistor can be substantially the same physical structure, and that the way in which the field effect transistor 12 is configured can determine which terminal is the source and which terminal is the drain. Thus, in the following description, the terms "source" and "drain" can be interchanged in accordance with certain implementations. The linear resistance circuit 10 can also include a first explicit resistor 14, a second explicit resistor 15, and a bidirectional current source 16. An output resistor 19 can be included in series with the linear resistance circuit 10 and the output node.

The field effect transistor 12 can be any suitable field effect transistor. In some implementations, the field effect transistor 12 can represent two or more field effect transistors in series and/or parallel. Although an NMOS transistor is illustrated in FIG. 1A, a PMOS transistor can alternatively be used. In some instances, the field effect transistor 12 can be a metal oxide field effect transistor (MOSFET). In other instances, the field effect transistor can be, for example, a CNFET, a DEPFET, a DNAFET, a FREDFET, a HEMT, an IGBT, an ISFET, a JFET, a MESFET, a MODFET, a NOMFET, an OFET, or the like. Moreover, the field effect transistor can be formed using any suitable process, such as bulk CMOS or silicon on insulator (SOI), among others. In addition, while the terms "metal" and "oxide" may be present in, for example, a MOSFET, these transistors can have gates made out of materials other than metals, such as polysilicon, and have dielectric oxide regions made from dielectrics other than silicon oxide, such as a high-k dielectric.

The field effect transistor 12 can operate in various modes of operation, such as a weak-inversion mode, a linear region, and a saturation region. When voltage from gate to source $V_{GS}$ is less than the threshold voltage $V_T$, the field effect transistor 12 can operate in the weak-inversion mode. In the weak-inversion mode, the field effect transistor 12 is generally turned off, and the current at the drain $I_D$ can be a sub-threshold leakage current. When the voltage from gate to source $V_{GS}$ is greater than the threshold voltage $V_T$ and a voltage from drain to source $V_{DS}$ is less than a voltage from gate to source $V_{GS}$ minus the threshold voltage $V_T$, the field effect transistor 12 can operate in the linear region. When the voltage from gate to source $V_{GS}$ is greater than the threshold voltage $V_T$ and a voltage from drain to source $V_{DS}$ is greater than a voltage from gate to source $V_{GS}$ minus the threshold voltage $V_T$, the field effect transistor 12 can operate in the saturation region. The current source 16 can turn the field effect transistor 12 on or off to ensure that the field effect transistor 12 is either in the ohmic region or in the weak-inversion mode. In the ohmic region, the field effect transistor 12 can be used as a linear resistor. By contrast, in the weak-inversion mode, the field effect transistor 12 is off and the current source 16 can prevent any significant current from flowing through the field effect transistor 12.

Figure 6:
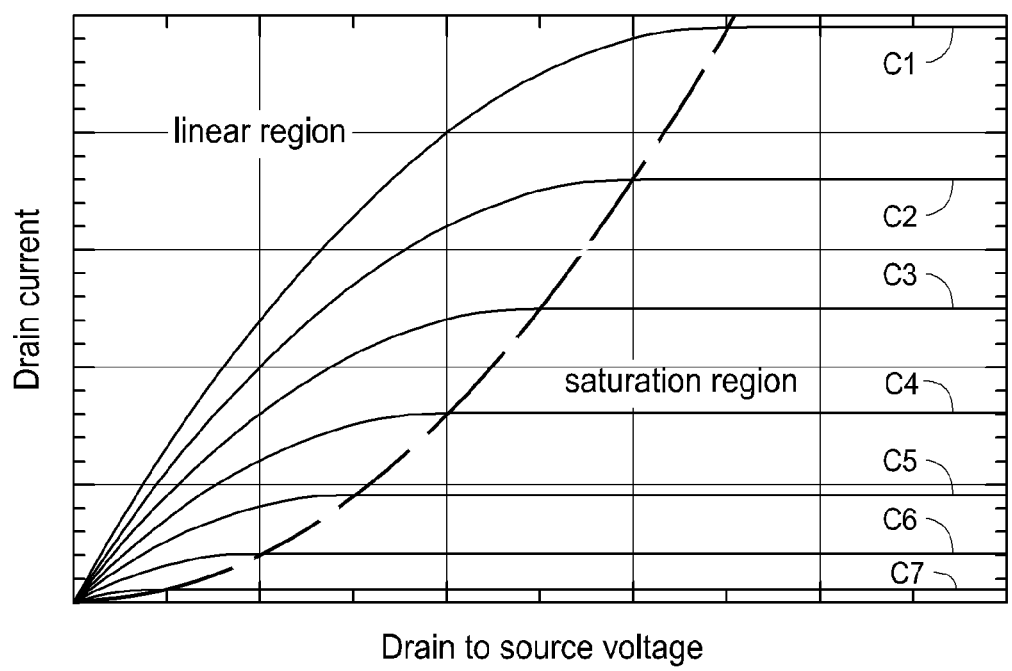
FIG. 6 illustrates the linear region of operation of a field effect transistor.

FIG. 6 illustrates a relationship between drain current $I_D$ of the field effect transistor 12 and drain to source voltage $V_{DS}$ of the field effect transistor 12. Curves C1 to C7 illustrate drain current $I_D$ versus drain to source voltages $V_{DS}$ for various voltage differences between a voltage from gate to source $V_{GS}$ and the threshold voltage $V_T$. In FIG. 6, curve C1 has the highest voltage difference and curve C7 has the lowest voltage difference. To the left of the dashed curve in FIG. 6, the curves C1 to C7 correspond to operating in the linear region of the field effect transistor 12. To the right of the dashed curve in FIG. 6, the curves the curves C1 to C7 correspond to operating in the saturation region of the field effect transistor 12.

The field effect transistor 12 can be modeled as a resistor when operating in the linear region. In general, a field effect transistor operates in the linear region when a voltage from gate to source $V_{GS}$ is greater than the threshold voltage $V_T$ and a voltage from drain to source $V_{DS}$ is less than a voltage from gate to source $V_{GS}$ minus the threshold voltage $V_T$. The current at the drain $I_D$ in relation to $V_{DS}$ can be modeled by Equation 1:

$$I_D = \mu C_{ox} \frac{W}{L}\left((V_{GS} - V_T)V_{DS} - \frac{V_{DS}^2}{2}\right) \quad \text{(Eq. 1)}$$

In Equation 1, $I_D$ can represent the current at the drain of the field effect transistor 12, $\mu$ can represent a charge-carrier effective mobility, $C_{OX}$ can represent an oxide capacitance of the gate of the field effect transistor 12 per unit of area, $V_{GS}$ can represent the voltage from the gate to the source of the field effect transistor 12, $V_T$ can represent the threshold voltage of the field effect transistor 12, and $V_{DS}$ can represent the voltage from the drain to the source of the field effect transistor 12.

By applying an average of a voltage at the source and a voltage at the drain to the gate of the field effect transistor 12, the field effect transistor 12 can behave as a linear resistor, and a linear relationship can exist between the current at the drain $I_D$ and the drain-to-source voltage $V_{DS}$. In particular, applying the average of the voltage at the source and the voltage at the drain to the gate of the field effect transistor 12 can remove the $V_{DS}$ squared term of Equation 1 such that the field effect transistor 12 operates more linearly. For this linearity improvement to occur, the field effect transistor 12 should stay in the linear region when on.

Parasitic capacitances of the field effect transistor 12 (for example, from gate to source and/or from gate to drain) can reduce a bandwidth for which the field effect transistor 12 operates as a linear resistor. An isolation resistor can be added, for example, to isolate these parasitic capacitances from alternating current (AC) ground. The isolation resistor can be an explicit resistor with a first end coupled to a control signal and a second end coupled to the gate of the field effect transistor or, as illustrated in FIG. 1, the bidirectional current source 16 can have a parasitic resistance that behaves as the isolation resistor. The isolation resistor can also linearize the field effect transistor 12 by allowing the parasitic capacitances between the gate and source and the gate and drain to add the average of voltages at the input IN and the output OUT to the gate voltage.

In addition to having a resistance, the isolation resistor can also have a parasitic capacitance. The bidirectional current source 16 can also have a corresponding parasitic capacitance. As long as the parasitic capacitance of the isolation resistor (or the bidirectional current source 16) is small compared to the parasitic capacitances from the gate to source and the gate to drain of the field effect transistor 12, the resistance of the isolation resistor can be increased to allow the average signal to be added to the gate at a desired frequency of interest. The average signal can represent the average voltage of the input IN and the output OUT.

However, as the isolation resistor becomes physically larger and/or has a larger resistance, the parasitic capacitance of the isolation resistor can begin to attenuate the voltage applied to the gate of the field effect transistor 12. Attenuating the voltage applied to the gate of the field effect transistor 12 can reduce the linearity of the relationship between current at the drain $I_D$ of the field effect transistor 12 and the voltage from the drain to the source $V_{DS}$ of the field effect transistor 12. Accordingly, this attenuation can reduce the linearity of the field effect transistor 12 when the field effect transistor 12 operates in the linear region. Such attenuation can result in a frequency at which sizing of the isolation resistor stops producing a desired level of linearity of the field effect transistor 12 in the ohmic region. In particular, the field effect transistor 12 may not operate with a desired level of linearity at lower frequencies near or at DC.

In some instances, an on resistance from the drain to the source of the field effect transistor 12 can be close to zero when the field effect transistor 12 is on. This implies that the voltage at the input IN is about equal to the voltage at the output OUT. Assuming that the voltage at the input IN is about equal to the voltage at the output OUT, the voltage $V_G$ at the gate of the field effect transistor 12 can be modeled by Equation 2:

$$V_G = V_{IN} \frac{C_{GS} + C_{GD}}{C_R + C_{GS} + C_{GD}} \cdot \frac{1}{1 + \frac{1}{sR_{ISO} \cdot (C_{GS} + C_{GD} + C_R)}} \quad \text{(Eq. 2)}$$

According to Equation 2, a larger parasitic capacitance $C_R$ of the isolation resistor or (bidirectional current source 16) can increase a difference between the gate voltage $V_G$ of the field effect transistor 12 and the input voltage $V_{IN}$, thereby reducing the linearity of the field effect transistor 12 as a resistor. In Equation 2, $C_{GS}$ can represent the parasitic capacitance from the gate to the source of the field effect transistor 12, $C_{GD}$ can represent the parasitic capacitance from the gate to the drain of the field effect transistor 12, $R_{ISO}$ can represent the resistance of the isolation resistor (or parasitic resistance of the bidirectional current source 16), and s can represent $j2\pi f$.

Resistors can apply an averaging voltage to the gate of the field effect transistor 12. The averaging voltage can represent an average of the source voltage and of the drain voltage of the field effect transistor 12. Such resistors can set the DC coupling from the input signal IN to a suitable level such that the averaging voltage is applied to the gate of the field effect transistor 12 at frequencies near or at DC.

A transfer function for voltage gain from the input IN to the gate of the field effect transistor 12 can be an indicator of linearity. With the averaging resistors, the gain at DC $G_{DC}$ of the transfer function of voltage from the input IN to the gate of the field effect transistor 12 can be represented by Equation 3:

$$Gdc = \frac{R\text{out}}{R\text{out} + \frac{R\text{avg}}{2}} \quad \text{(Eq. 3)}$$

In Equation 3, $G_{DC}$ can represent a ratio of the gate voltage of the field effect transistor 12 divided by the voltage at the input IN; $R_{AVG}$ can represent the resistance of each of the averaging resistors, such as the explicit resistors 14 and 15 of the linear resistance circuit 10; and $R_{OUT}$ can represent the parasitic output impedance of the bidirectional current source 16.

With the averaging resistors, the gate voltage $V_G$ of the field effect transistor 12 can be represented by as shown in Equation 4:

$$V = Vin \cdot Gdc \cdot \frac{1 + \frac{s}{wz}}{1 + \frac{s}{wp}} \quad \text{(Eq. 4)}$$

In Equation 4, $V_{IN}$ can represent voltage at the input IN, wz can represent the radian frequency of a zero of the transfer function from input IN to gate voltage of the field effect transistor 12, wp can represent the radian frequency of a pole of the transfer function from the input IN to gate voltage of the field effect transistor 12, and s can represent j2πf. The radian frequency of the zero wz and the radian frequency of the pole wp of the transfer function can be represented by Equations 5 and 6, respectively.

$$wz = \frac{1}{(Cgs + Cgd) \cdot \frac{Ravg}{2}} \quad \text{(Eq. 5)}$$

$$wp = \frac{1}{(Cgs + Cgd + Cout) \cdot \frac{Rout \cdot \frac{Ravg}{2}}{Rout + \frac{Ravg}{2}}} \quad \text{(Eq. 6)}$$

In Equations 5 and 6, $C_{GS}$ can represent the parasitic capacitance from the gate to the source of the field effect transistor 12, $C_{GD}$ can represent the parasitic capacitance from the gate to the drain of the field effect transistor 12, and $C_{OUT}$ can represent the parasitic capacitance of the bidirectional current source 16.

With the averaging resistors, the gain at high frequencies $G_{HF}$ of the transfer function of voltage from the input IN to the gate of the field effect transistor 12 can be represented by Equation 7. High frequencies can be frequencies above the pole when $G_{HF}$ is greater than $G_{DC}$ and frequencies above the zero of the transfer function when $G_{DC}$ is greater than $G_{HF}$.

$$Ghf = \frac{Cgs + Cgd}{Cgs + Cgd + Cout} \quad \text{(Eq. 7)}$$

According to Equations 3-7, the use of averaging resistors can allow the DC coupling from the input IN to the gate of the field effect transistor 12 to operate at an acceptable level such that the average voltage of the input IN and the output OUT can be applied to the gate of the field effect transistor 12 down to DC. So long as the coupling from the input IN to the gate of the field effect transistor 12 at high frequency and low frequency are acceptable, the relationships described in Equations 3-7 should hold true. Accordingly, the field effect transistor 12 can operate linearly as a resistor regardless of the location of the pole and the location of the zero of the transfer function from the input IN to the gate of the field effect transistor 12. Moreover, the relationship described in Equation 4 should hold true when $G_{HF}$ is greater than $G_{DC}$ and when $G_{DC}$ is greater than $G_{HF}$.

Referring back to FIG. 1, the illustrated linear resistance circuit 10 includes a first explicit resistor 14 and a second explicit resistor 15. In some implementations, the first explicit resistor 14 and/or the second explicit resistor 15 can represent two or more resistors in series and/or parallel. Explicit resistors can correspond to resistive circuit elements rather than to parasitic resistances.

The first explicit resistor 14 can have a first end coupled to the source of the field effect transistor 12 and a second end coupled to the gate of the field effect transistor 12. The second explicit resistor 15 can have a first end coupled to the drain of the field effect transistor 12 and a second end coupled to the gate of the field effect transistor 12. Together, the first explicit resistor 14 and the second explicit resistor 15 can apply an averaging voltage to the gate of the field effect transistor 12, in which the averaging voltage represents an average of a voltage at the drain and a voltage at the source of the field effect transistor 12. The first explicit resistor 14 and the second explicit resistor 15 can be referred to as "averaging resistors" because these resistors can serve such that the average of the source voltage and the drain voltage can be applied at the gate of the field effect transistor 12. In some embodiments, the resistance of the first explicit resistor 14 and/or the resistance of the second explicit resistor 15 can be selected in the range from about 1 KΩ to 10 KΩ.

The first explicit resistor 14 and the second explicit resistor 15 can have approximately the same resistance as each other. The resistance of the first explicit resistor 14 and the second explicit resistor 15 can each be large compared to an effective resistance in parallel with the source and the drain of the field effect transistor 12. Such sizing can prevent the first explicit resistor 14 and the second explicit resistor 15 from interfering with performance (for example, accuracy) of a circuit that includes the linear resistance circuit 10, such as an attenuator. In some instances, the resistance of the explicit resistors 14, 15 can be at least 10 times greater that the effective resistance in parallel with the source and the drain of the field effect transistor. In some embodiments, the effective resistance in parallel with the source and the drain of the field effect transistor can be selected in the range from about 10Ω to 100Ω. The resistance of the first explicit resistor 14 and the second explicit resistor 15 can be sufficiently large such that a positive portion 17 of the bidirectional current source 16 can be sized suitably small so as to not generate a significant noise and/or a significant offset on the source and/or drain of the field effect transistor 12.

The linear resistance circuit 10 illustrated in FIG. 1 also includes a bidirectional current source 16. The bidirectional current source 16 can control the field effect transistor 12 by applying a current to the gate of the field effect transistor 12. For example, a positive current portion 17 of the bidirectional current source 16 can apply a positive current to the gate to turn on the field effect transistor and a negative current portion 18 of the bidirectional current source 16 can apply a negative current having the opposite polarity of the positive current to the gate to turn off the field effect transistor 12. The positive current portion 17 and the negative current portion 18 of the bidirectional current source 16 can activate in response to one or more current control signals $I_{CONTROL}$. The negative current and the positive current can have approximately equal magnitudes in some implementations and different magnitudes in other implementations. In one non-limiting example, the positive current can range from about 300 uA to 400 uA and the negative current can range from about −250 uA to −350 uA. The bidirectional current source 16 can isolate the parasitic capacitances of the field effect transistor 12 from AC ground. For instance, the parasitic resistance of the bidirectional current source 16 can function as an isolation resistor.

The bidirectional current source 16 can be implemented with any suitable circuit elements, such as bipolar junction transistors, field effect transistors, or the like, or any combination thereof. In some instances, the bidirectional current source 16 can include a cascode circuit topology to generate the positive current and/or the negative current.

An output impedance of the bidirectional current source 16 should be larger than the resistance of the first explicit resistor 14 and/or the second explicit resistor 15. For instance, the output impedance of the bidirectional current source 16 can be at least 10 times the resistance of the first explicit resistor 14. When the output impedance of the bidirectional current source 16 is larger than the resistance of the first explicit resistor 14 and/or the second explicit resistor 15, deviations of the gain of the field effect transistor 12 at DC for unity gain (i.e., a gain of 1) can be reduced.

A parasitic capacitance of the bidirectional current source 16 should be smaller than the sum of the parasitic capacitance of the gate to the source of the field effect transistor 12 and the parasitic capacitance of the gate to the drain of the field effect transistor 12. This can reduce deviations from the gain of the field effect transistor 12 at high frequencies (for example, frequencies above which the field effect transistor 12 operates in the ohmic region) for unity gain (i.e., a gain of 1). In some implementations, the parasitic capacitance of the bidirectional current source 16 can be less than or equal to approximately one fifth (⅕) of the parasitic capacitance of the gate to source plus the gate to drain of the field effect transistor 12.

In some instances, the parasitic capacitance of the bidirectional current source 16 can be small compared to a substrate capacitance of the field effect transistor 12 such that frequency performance of a circuit that includes the linear resistance circuit 10, such as an attenuator or a programmable filter, is not substantially degraded. The parasitic capacitance of the bidirectional current source 16 can be less than or equal to approximately one half (½) of the substrate capacitance of the field effect transistor 12, according to some implementations.

The bidirectional current source 16 can generate an offset at the source and/or the drain of the field effect transistor 12. The offset can result from current generated by the bidirectional current source 16 passing through the first explicit resistor 14 to the source of the field effect transistor 12 and/or through the second explicit resistor 14 to the drain of the field effect transistor 12. The offset can be a DC level current injection. When the current provided to the gate of the field effect transistor 12 is relatively small, the offset may not have a significant impact on the performance of the field effect transistor 12 as a linear resistor. However, in certain applications, it can be desirable to remove the offset from the source and/or the drain of the field effect transistor 12.

Figure 2:
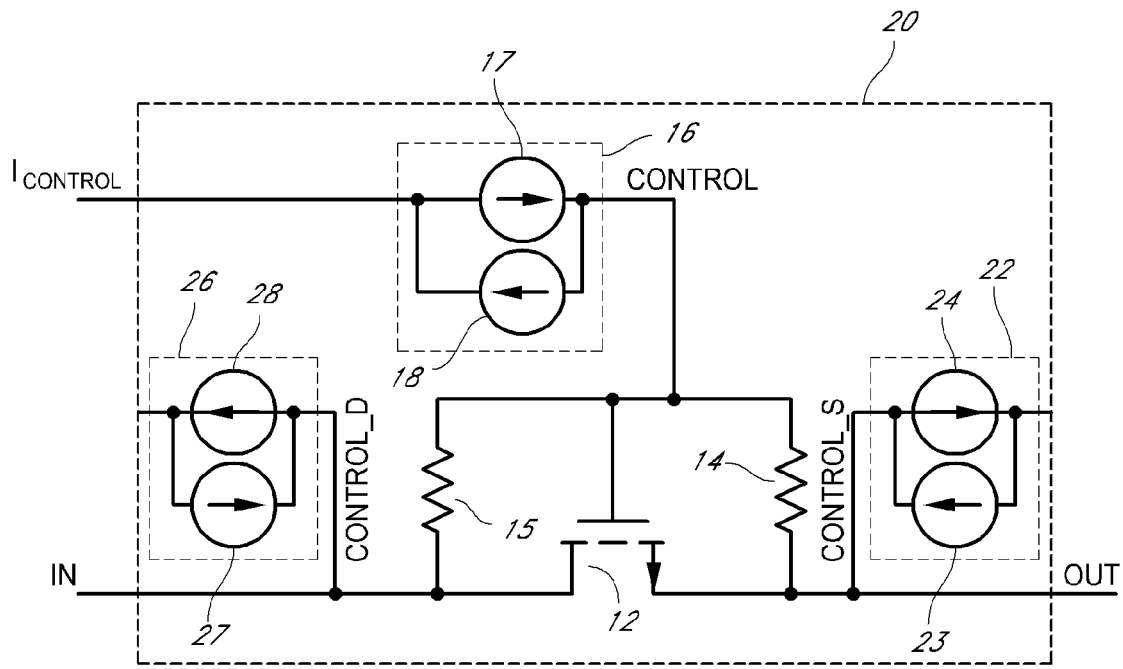
FIG. 2 is a schematic diagram illustrating a linear resistance circuit including a field effect transistor, according to another embodiment.

FIG. 2 is a schematic diagram illustrating a linear resistance circuit 20 including a field effect transistor 12, according to another embodiment. The linear resistance circuit 20 can correct for the offset on the source and/or the drain of the field effect transistor 12 that is generated by the bidirectional current source 16. The linear resistance circuit 20 can include any combination of features of the linear resistance circuit 10, for example, as described with reference to FIG. 1. Additionally, the linear resistance circuit 20 includes at least one additional current source coupled to the source and/or the drain of the field effect transistor 12. The linear resistance circuit 20 can include a second current source 22 coupled to the source of the field effect transistor 12 and a third current source 26 coupled to the drain of the field effect transistor 12. For example, as illustrated in the embodiment illustrated in FIG. 2, the second current source 22 can be bidirectional and have a positive current portion 23 and a negative current portion 24 and a third current source 26 can be bidirectional and include a positive current portion 27 and a negative current portion 28. In some embodiments, the second current source 22 and/or the third current source 26 can include any combination of features of the bidirectional current source 16, for example, as described with reference to FIG. 1. According to certain embodiments, the second current source 22 and/or the third current source 26 can be configured to generate approximately half of the current that the bidirectional current source 16 is configured to generate.

When the field effect transistor 12 is on, the second current source 22 can remove an offset generated by the positive portion 17 of the bidirectional current source 16 at the source by generating a current to cancel the current from the bidirectional current source 16 applied to the source of the field effect transistor 12. Alternatively or additionally, when the field effect transistor 12 is on, the third current source 26 can remove an offset generated by the positive portion 17 of the bidirectional current source 16 at the drain by generating a current to cancel the current from the bidirectional current source 16 applied to the drain of the field effect transistor 12.

When the field effect transistor 12 is off, the negative portion 18 of the bidirectional current source 16 can ensure that the field effect transistor 12 remains in the off state, even in the presence of a signal having a large magnitude (for example, approximately 2 V) being applied to the drain of the field effect transistor 12. For instance, when the field effect transistor 12 is off, the negative portion 18 of the bidirectional current source 16 can generate a negative current at the gate of the field effect transistor 12. The second current source 22 and/or the third current source 26 can remove an offset generated by the negative portion 18 of the bidirectional current source 16 by generating current to cancel the offset. Reducing and/or removing the offset can help keep the field effect transistor 12 in the off state, for example, when a signal having a large magnitude is applied to the drain of the field effect transistor 12.

The linear resistance circuits 10 and/or 20 can be embodied, for example, in a controllable attenuator. Attenuators can reduce an amplitude and/or power of a signal without appreciably distorting a waveform of the signal.

Figure 3:
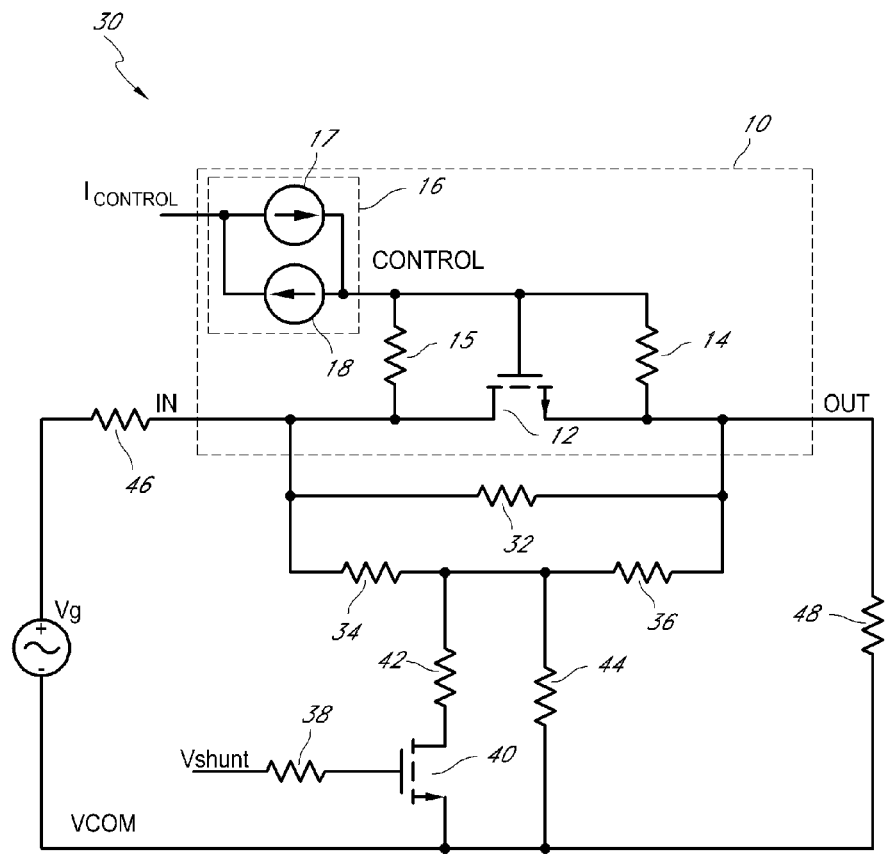
FIG. 3 illustrates an example attenuator that includes a linear resistance circuit, according to an embodiment.

FIG. 3 illustrates an example attenuator 30 that includes a linear resistance circuit 10, according to an embodiment. It will be understood that the attenuator 30 can alternatively use a linear resistance circuit 20 in place of the illustrated linear resistance circuit 10. The illustrated attenuator 30 is a bridged T controllable attenuator. The attenuator 30 can also include a resistive network and a shunt circuit.

The resistive network can include a linear resistance circuit 10, a series resistor 32, matching resistors 34 and 36, and a common node resistor 44. The linear resistance circuit 10 can be coupled in parallel with the series resistor 32. The series resistor 32 can have a first end coupled to an input IN and a second end coupled to an output OUT. Matching resistors 34 and 36 can have a resistance matching the input impedance, as modeled by input resistor 46, and the output impedance, as modeled by the output resistor 48. For instance, in some embodiments, the matching resistors can have a resistance of 50Ω or 75Ω. The common node resistor 44 can have a first end coupled to the common node $V_{COM}$ and a second end coupled to both of the matching resistors 34 and 36 to form a T.

The shunt circuit can include a shunt isolation resistor 38, a shunt transistor 40, and a shunt resistor 42. The shunt isolation resistor 38 can isolate a control terminal of the shunt transistor 40, such as a gate when the shunt transistor 40 is a field effect transistor, from AC ground. The shunt circuit can adjust the attenuation of the attenuator 30 by selectively activating the shunt transistor 40 in response to the shunt control signal $V_{SHUNT}$. In this way the resistance in parallel with the common node resistor 44 can be adjusted.

The attenuator 30 can adjust the attenuation of the output OUT by selectively activating the field effect transistor 12 of the linear resistance circuit 10 and the shunt transistor 40. For example, the attenuator 30 can provide an attenuation of 0 dB when the positive portion 17 of the bidirectional current source 16 is turned on in response to the control signal $I_{CONTROL}$, the negative portion 18 of the bidirectional current source 16 is turned off in response to the control signal $I_{CONTROL}$, and the shunt control signal $V_{SHUNT}$ has a logical low value (for example, 0 V). Continuing with this example, the attenuator 30 can provide an attenuation of 1 dB when the positive portion 17 of the bidirectional current source 16 is turned off in response to the control signal $I_{CONTROL}$, the negative portion 18 of the bidirectional current source 16 is turned on in response to the control signal $I_{CONTROL}$, and the shunt control signal $V_{SHUNT}$ has a logical high value (for example, approximately 3.3 V). Table 1 below summarizes this example operation of the attenuator 30.

TABLE 1

| Attenuation | Positive Current Portion | Negative Current Portion | $V_{SHUNT}$ |
|---|---|---|---|
| 0 dB | On | Off | Low |
| 1 dB | Off | On | High |

The averaging resistors 14 and 15 of the linear resistance circuit 10 can apply the average of the voltage at the source of the field effect transistor 12 and the voltage at the drain of the field effect transistor 12 to the gate of the field effect transistor 12 at low frequencies down to DC. Simulation data has shown significant improvement in the linearity of the field effect transistor 12, for example, improvements of as much as 38 dB in intermodulation distortion of a third order at low frequencies near DC compared to conventional linear resistance circuits.

Figure 4:
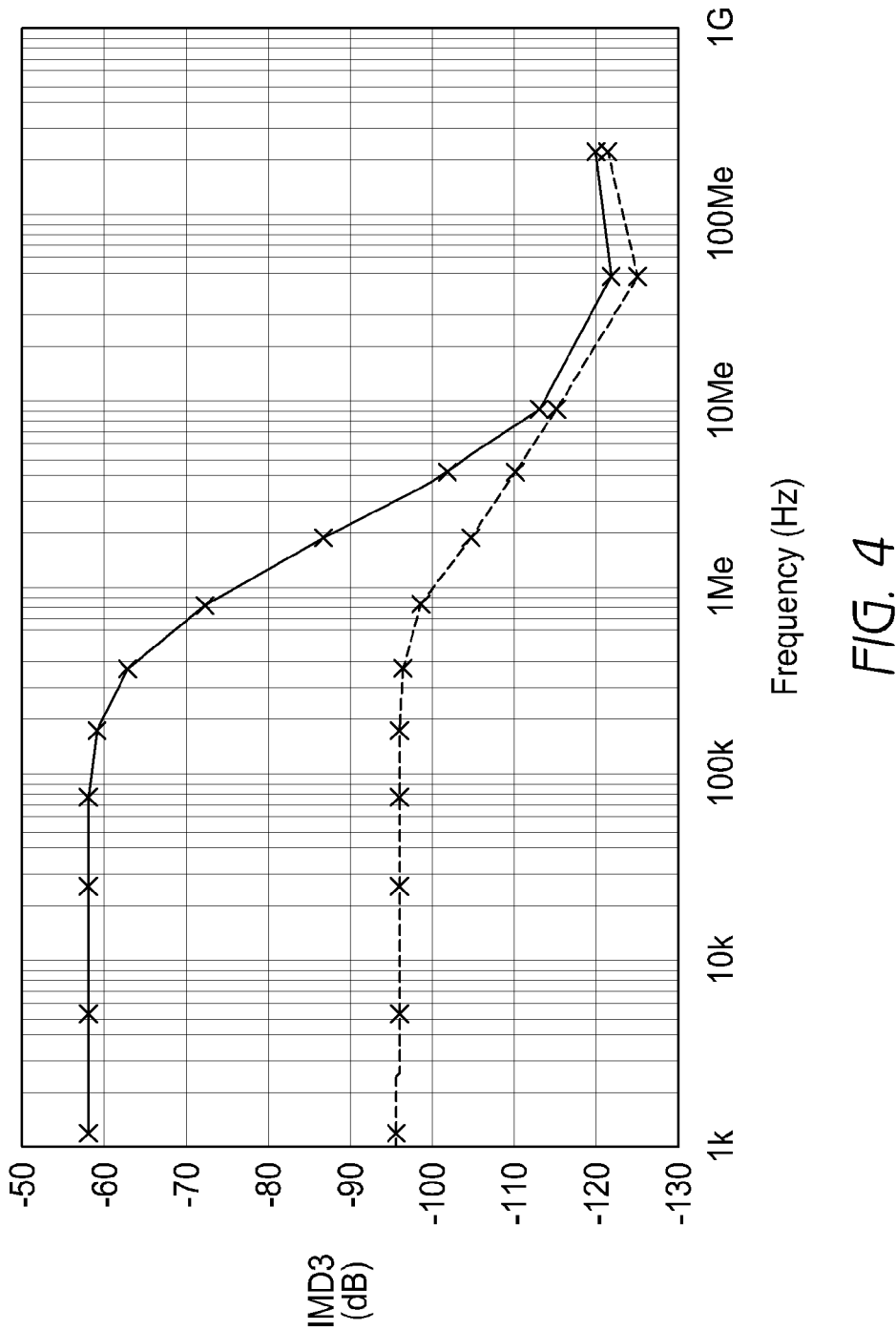
FIG. 4 is a graph illustrating a relationship among frequency responses of attenuators that shows improvement in intermodulation distortion of a third order according to an embodiment.

FIG. 4 is a graph illustrating a relationship among frequency responses of attenuators that shows improvement in intermodulation distortion of a third order (IMD3) according to an embodiment. Reducing such a distortion can be advantageous because the distortion can be in the signal band, and the distortion may not be filtered out by the attenuator. For instance, IMD3 can be a significant problem for narrow band signals in which the distortion is in the signal band. With reference to FIG. 4, the dashed curve represents an attenuator of FIG. 3 and the solid curve in represents a conventional attenuator without averaging resistors. The attenuators were set to bypass mode, in which the attenuators do not attenuate, to investigate the non-linearity of the field effect transistor 12. The curves illustrated in FIG. 4 represent IMD3 as a function of frequency for a 1 V peak to peak composite signal. As shown in the graph of FIG. 4, the attenuator of FIG. 3 has a significantly lower IMD3 at lower frequencies of about 300 kHz and below. Simulation data indicate an improvement in IMD3 of as much at 38 dB at lower frequencies, as shown in FIG. 4. As also shown in FIG. 4, simulation data indicate an improvement of approximately 8 dB in IMD3 at 4 MHz.

Thus, IMD3 can be improved by including averaging resistors as shown in the linear resistance circuits 10 and 20 and controlling the gate of a field effect transistor 12 with a bidirectional current source 16. This can result in the field effect transistor 12 operating more linearly as a resistor, particularly at lower frequencies of 4 MHz or less.

Additional simulation data and analysis indicate that improvement in IMD3 should result from the difference between the voltage at the gate of the field effect transistor 12 and the average of the voltage at the source of the field effect transistor 12 and the voltage at the drain of the field effect transistor 12. Neither the magnitude of the average of the source and drain voltages nor the phase of the source and drain voltages alone appear to cause the improvement in IMD3 shown in FIG. 4.

Other simulation data indicate that the averaging resistors should not significantly affect performance of the attenuator 30 of FIG. 3 compared to conventional attenuators without averaging resistors. The parasitics of the linear resistance circuit 10 do not appear to cause bandwidth degradation in either state of the attenuator 30.

Figure 5:
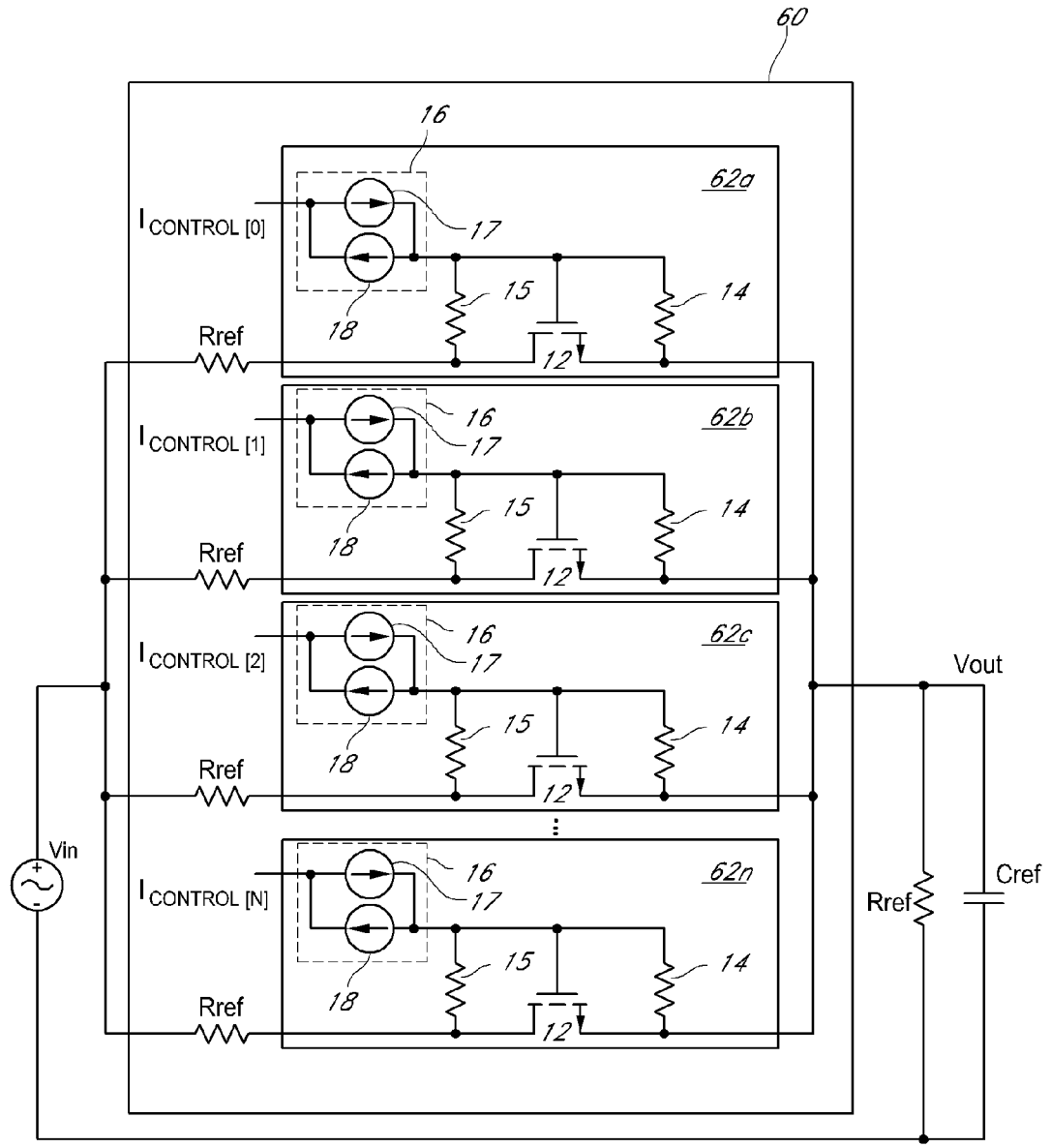
FIG. 5 illustrates an example programmable filter that includes a plurality of linear resistance circuits, according to an embodiment.

Referring to FIG. 5, an example of a programmable filter 60 that includes a plurality of linear resistance circuits 62a-62n will be described. Each of the linear resistance circuits 62a-62n can implement any combination of features described earlier in connection with the linear resistance circuit 10 (as shown in FIG. 5 for illustrative purposes) and/or the linear resistance circuit 20 (not shown). Any suitable number of linear resistance circuits 62a-62n can be implemented. For instance, in some implementations, 2, 4, 8, 16, 32, 64 or more linear resistance circuits 62a-62n can be utilized. The programmable filter 60 can adjust the bandwidth of an input signal Vin passed through the programmable filter 60 by activating and/or deactivating one or more linear resistance circuits 62a-62n.

A programmable filter 60 that includes one or more variable resistance circuits that include a plurality of linear resistance circuits can be any suitable filter with a need for a variable resistance circuit. A variable resistance can be generated using a plurality of linear resistance circuits. Each linear resistance circuit can be activated by a control signal $I_{CONTROL}$. The control signal $I_{CONTROL}$ can provide additional resistance from a linear resistance circuit in parallel with other linear resistance circuits, thereby reducing resistance from an input (for example, $V_{IN}$) to an output (for example, $V_{OUT}$) of a variable resistance circuit. For example, a control signal $I_{CONTROL}$ can be provided to the gate of a field effect transistor 12. When the field effect transistor 12 is on, the resistance of a linear resistance circuit can be added in parallel with other linear resistance circuits, if any, that also include a field effect transistor 12 that is on. Similarly, when the field effect transistor 12 is off, the resistance of a linear resistance circuit can be excluded from the total resistance in parallel with other linear resistance circuits that also include a field effect transistor 12 that is on. In this way, resistance of the variable resistance circuit can be increased.

In some implementations, each linear resistance circuit can provide substantially the same resistance as at least one other linear resistance circuit in the variable resistance circuit. Alternatively or additionally, a linear resistance circuit can provide a different resistance than one or more other linear resistance circuits in the variable resistance circuit. According to some implementations, each linear resistance circuit in a variable resistance circuit can have a resistance that is a ratio of another linear resistance circuit. For instance, each linear resistance circuit can have double the resistance of the next linear resistance circuit.

A programmable filter can be a low pass filter, a band pass filter, and/or a high pass filter. The programmable filter 60 illustrated in FIG. 5 can be used as a low pass filter. The linear resistance circuits 10 and/or 20 can improve performance of the low pass filter at lower frequencies due to the improved linearity at or near DC. The programmable filter 60 can be programmed using the control signals $I_{CONTROL}[N:0]$ to adjust a cutoff frequency below which signals are passed and above which signals are attenuated by reducing their amplitude.

In a non-limiting example, when the programmable filter 60 includes four linear resistance circuits 62a-62n, the cutoff frequency of the programmable filter 60 can be from approximately 1.25 MHz to 5 MHz in certain implementations. Although a programmable filter 60 with a cutoff frequency from about 1.25 MHz to 5 MHz will be described for illustrative purposes, many other cutoff frequencies can be implemented in connection with the programmable filter 60. For instance, some programmable filters can have a cutoff frequency ranging from about 5 MHz to 40 MHz. When the field effect transistor 12 of the linear resistance circuit 62a is on and the field effect transistors 12 of the linear resistance circuits 62b-62n are off, the cutoff frequency can be approximately 1.25 MHz. Generally, when only one linear resistance circuit is activated by having a field effect transistor driving the output on, the filter can have a lowest programmable cutoff frequency because the variable resistance circuit has the highest resistance. Conversely, when all of the linear resistance circuits 62a-62n are activated by their respective control signals, the filter can have the highest programmable cutoff frequency because the parallel resistances of the linear resistance circuits will create the lowest resistance for the variable resistance circuit. With reference to the non-limiting example with four linear resistance circuits, when the field effect transistors 12 in the linear resistance circuits 62a-62n are all on, the cutoff frequency can be approximately 5 MHz.

In a general case, the programmable filter 60 can have a cutoff frequency that is represented by Equation 8:

$$\text{cutoff frequency} = \frac{n}{2\pi * R_{REF} * C_{REF}} \quad \text{(Eq. 8)}$$

In Equation 8, n can represent the number of linear resistance circuits having substantially the same resistance, $R_{REF}$ can represent a resistance between the input Vin and a drain of the field effect transistor of a linear resistance circuit driving the output $V_{OUT}$, and $C_{REF}$ can represent a capacitance coupling the output $V_{OUT}$ to the common voltage $V_{COM}$ (for example, ground).

In the embodiments described above, systems with linear resistance circuits were described in conjunction with particular embodiments. It will be understood, however, that the principles and advantages of the embodiments can be used for any other systems, apparatus, or methods with a need for linearizing a field effect transistor as a resistor. For example, any systems, apparatus, or methods with a need for linearizing a field effect transistor as a resistor at lower frequencies, such as frequencies at or near DC.

Such methods, systems, and/or apparatus can be implemented into various electronic devices. Examples of the electronic devices can include, but are not limited to, consumer electronic products, parts of the consumer electronic products, electronic test equipment, etc. Examples of parts of consumer electronic products can include rectifiers, programmable filters, attenuators, variable frequency circuits, circuit having an output coupled to an input of an analog-to-digital converter, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
   a field effect transistor having a gate, a source, and a drain;
   a first explicit resistor having a first end coupled to the drain and a second end coupled to the gate;
   a second explicit resistor having a first end coupled to the source and a second end coupled to the gate; and
   a bidirectional current source configured to selectively turn on the field effect transistor to the linear region of operation and selectively turn the field effect transistor off, wherein the bidirectional current source is configured to isolate the parasitic capacitances of the field effect transistor from alternating current (AC) ground.

2. The apparatus of claim 1, wherein the first explicit resistor and the second explicit resistor are configured to apply an averaging voltage to the gate, wherein the averaging voltage is indicative of an average of a voltage at the drain and a voltage at the source.

3. The apparatus of claim 2, wherein the first explicit resistor and the second explicit resistor are configured to allow the field effect transistor to operate linearly down to direct current (DC).

4. The apparatus of claim 2, wherein the first explicit resistor and the second explicit resistor are configured to allow the field effect transistor to operate linearly at frequencies less than or equal to approximately 300 kHz.

5. The apparatus of claim 1, wherein the first explicit resistor and the second explicit resistor are configured to reduce a difference between a DC voltage at the gate and an average of a DC voltage at the drain and a DC voltage at the source.

6. The apparatus of claim 1, further comprising a second current source configured to reduce a DC offset at the source, wherein the DC offset at the source is generated by the bidirectional current source.

7. The apparatus of claim 6, further comprising a third current source configured to reduce a DC offset at the drain, wherein the DC offset at the drain is generated by the bidirectional current source.

8. The apparatus of claim 7, wherein the second current source and the third current source are configured to prevent the field effect transistor from turning on when a relatively large voltage is applied to the drain.

9. The apparatus of claim 1, wherein a resistance of the first explicit resistor is approximately equal to a resistance of the second explicit resistor.

10. The apparatus of claim 1, wherein the field effect transistor is embodied in an attenuator, a rectifier, or a programmable filter.

11. The apparatus of claim 1, wherein the resistance of the first explicit resistor is at least 10 times greater than the effective resistance in parallel with the source and the drain of the field effect transistor.

12. The apparatus of claim 1, wherein an output impedance of the bidirectional current source is larger than an impedance of the first explicit resistor, and wherein a parasitic capacitance of the bidirectional current source is smaller than a sum of the parasitic capacitance of the gate to the source of the field effect transistor and the parasitic capacitance of the gate to the drain of the field effect transistor.

13. The apparatus of claim 1, wherein the first end of the first explicit resistor is directly connected to the drain of the field effect, and wherein the first end of the second explicit resistor is directly connected to the source of the field effect transistor.

14. An apparatus comprising:
   a field effect transistor having a gate, a source, and a drain, wherein the field effect transistor is configured to operate in the linear region of operation when on;
   averaging resistors configured to apply an averaging voltage to the gate of the field effect transistor at frequencies less than or equal to approximately 4 MHz, wherein the averaging voltage is indicative of an average of a voltage at the source of the field effect transistor and a voltage at the drain of the field effect transistor; and
   a bidirectional current source configured to selectively turn on the field effect transistor to the linear region of operation and selectively turn the field effect transistor off, wherein an output impedance of the bidirectional current source is larger than an impedance of the averaging resistors.

15. The apparatus of claim 14, further comprising at least one current source configured to reduce a DC offset at the source and a DC offset at the drain.

16. A method of using a field effect transistor, the method comprising:
   controlling activation of the field effect transistor with a bidirectional current source, the field effect transistor having a gate, a source, and a drain;
   operating the field effect transistor in the ohmic region when the bidirectional current source activates the field effect transistor; and
   applying an averaging voltage to the gate via explicit averaging resistors, wherein the averaging voltage is indicative of an average of a voltage at the drain and a voltage at the source, wherein a first resistor of the explicit averaging resistors is coupled to the drain, and wherein a second resistor of the explicit averaging resistors is coupled to the source.

17. The method of claim 16, wherein applying is performed at DC.

18. The method of claim 16, further comprising reducing a DC offset introduced at the source by the bidirectional current source.

19. The method of claim 18, wherein reducing is performed by at least one other current source.

20. The method of claim 16, further comprising reducing a DC offset introduced at the drain by the bidirectional current source.

* * * * *